United States Patent
Li

(10) Patent No.: US 10,851,954 B2
(45) Date of Patent: Dec. 1, 2020

(54) PROCESS FOR MANUFACTURING SILICA GEL EXTRUSION SOFT LAMP STRIP

(71) Applicant: BLUEVIEW ELEC-OPTIC TECH CO., LTD, Chengdu (CN)

(72) Inventor: Zhongxun Li, Chengdu (CN)

( * ) Notice: Subject to any disclaimer, the term of this patent is extended or adjusted under 35 U.S.C. 154(b) by 255 days.

(21) Appl. No.: 16/167,743

(22) Filed: Oct. 23, 2018

(65) Prior Publication Data

US 2019/0056077 A1  Feb. 21, 2019

Related U.S. Application Data

(63) Continuation of application No. PCT/CN2016/095955, filed on Aug. 19, 2016.

(30) Foreign Application Priority Data

Aug. 18, 2016  (CN) .......................... 2016 1 0681633

(51) Int. Cl.

| | |
|---|---|
| *H05K 3/30* | (2006.01) |
| *F21S 4/24* | (2016.01) |
| *F21V 31/00* | (2006.01) |
| *F21V 15/01* | (2006.01) |
| *F21S 4/22* | (2016.01) |
| *H05K 3/34* | (2006.01) |
| *H05K 3/36* | (2006.01) |
| *H05K 1/14* | (2006.01) |
| *F21K 9/90* | (2016.01) |
| *H05K 1/18* | (2006.01) |
| *F21Y 115/10* | (2016.01) |

(52) U.S. Cl.
CPC .................... *F21S 4/24* (2016.01); *F21K 9/90* (2013.01); *F21S 4/22* (2016.01); *F21V 15/013* (2013.01); *F21V 31/00* (2013.01); *H05K 1/14* (2013.01); *H05K 1/189* (2013.01); *H05K 3/341* (2013.01); *H05K 3/363* (2013.01); *F21Y 2115/10* (2016.08); *H05K 2201/10106* (2013.01); *Y10T 29/4913* (2015.01)

(58) Field of Classification Search
USPC ......................... 29/832, 829, 835, 840, 846
See application file for complete search history.

(56) References Cited

U.S. PATENT DOCUMENTS

| | | | |
|---|---|---|---|
| 9,699,841 B2 * | 7/2017 | Heimes ................. | H05B 45/37 |
| 2018/0014368 A1 * | 1/2018 | Radermacher ......... | H05B 45/10 |

FOREIGN PATENT DOCUMENTS

| | | |
|---|---|---|
| CN | 102889487 A | 1/2013 |
| CN | 102918318 A | 2/2013 |
| CN | 104676337 A | 6/2015 |
| CN | 105058733 A | 11/2015 |

OTHER PUBLICATIONS

Internation Search Report of PCT/CN2016/095955, dated May 25, 2017.

* cited by examiner

Primary Examiner — Thiem D Phan
(74) Attorney, Agent, or Firm — Erson IP (Nelson IP)

(57) ABSTRACT

A process for manufacturing a silica gel extruded soft lamp strip, comprises the following steps: a. pasting LED beads and other components on an FPC soft board, and performing reflow soldering; b. soldering the FPC soft board into a lengthened FPC soft board in a lead-free manual soldering manner; c. performing aging impact on the lengthened FPC soft board; d. performing pre-extrusion processing on the FPC soft board which is qualified after aging impact; e: extruding the FPC board using a solid silica gel mixture in combination with an extrusion mold, and then curing using a baking oven; and f. clipping from a connection plate position of a semi-finished product from the step e, and installing a plug so as to complete processing. The process can effectively ensure water-proof and moisture-proof properties, luminance uniformity and color temperature consistency of the LED soft lamp strip, and has a high practical value.

9 Claims, No Drawings

PROCESS FOR MANUFACTURING SILICA GEL EXTRUSION SOFT LAMP STRIP

CROSS-REFERENCE TO RELATED APPLICATIONS

This application is a continuation of International Patent Application No. PCT/CN2016/095955 with a filing date of Aug. 19, 2016, designating the United States, now pending, and further claims priority to Chinese Patent Application No. 201610681633.2 with a filing date of Aug. 18, 2016. The content of the aforementioned applications, including any intervening amendments thereto, are incorporated herein by reference.

TECHNICAL FIELD

The disclosure relates to a neon lamp strip, and particularly relates to a process for manufacturing a silica gel extrusion soft lamp strip.

BACKGROUND OF THE PRESENT INVENTION

With the popularization of LED (light-emitting diode) lamp application, there are various forms of LED lamp finished product. In some high-end LED products among which the LED neon lamp strip is one of representative product forms, bendable soft lamp products gradually take the place of hard LED lamp products. The LED neon lamp strip mainly includes a housing and a circuit board which is equipped with electronic components and LED beads. The whole housing is expected to achieve good sealing to ensure water-proof and moisture-proof effects, and thus the integrity of the housing is extremely important, while the toughness of its material must achieve a requirement that the neon lamp strip is bendable. The conventional processing technology hardly meets the technical index of the LED neon lamp strip.

SUMMARY OF PRESENT INVENTION

The object of the disclosure is to provide a process for manufacturing a silica gel extrusion soft lamp strip to solve the problem in the prior art that the LED lamp strip is difficult to manufacture.

In order to achieve the above object, the technical solutions adopted by the disclosure are as follows:

A process for manufacturing a silica gel extrusion soft lamp strip, comprises the following steps:

a. pasting LED beads and other components on an FPC soft board, and performing reflow soldering;

b. soldering the FPC soft board into a lengthened FPC soft board in a manner of lead-free manual soldering;

c. performing aging impact on the lengthened FPC soft board;

d. performing pre-extrusion processing on the FPC soft board which is qualified after aging impact;

e. extruding the FPC soft board using a solid silica gel mixture in combination with an extrusion mold, and then curing using a baking oven; wherein the solid silica gel mixture is prepared from silicone rubber and a vulcanizing agent including but not limited to a platinum vulcanizing agent according to a required mass ratio; and f. clipping from a connection plate position of a cured semi-finished product from step (e), installing a plug, performing a product qualification test, packaging the qualified products and then putting in storage for later selling or use.

Advantageously, the step a specifically comprises the following steps:

a1. performing spray printing of a recognition code on the back surface of the FPC soft board;

a2. coating lead-free solder paste at a bonding pad of the FPC soft board;

a3. pasting the LED beads and other components on the FPC soft board within 10 minutes after the solder paste is coated;

a4. putting the pasted FPC soft board into a reflow soldering machine having set parameters within 2 hours, taking out the soft board from an outlet after 8 minutes, visually inspecting at first, and then connecting a test tooling to test brightness and color temperature; and a5. transporting qualified products in step a4 to a next process step through an anti-static cart.

The step b specifically comprises the following steps:

b1. brushing soldering flux at the bonding pads of the two ends of the FPC soft board transported from step a;

b2. manually adding tin to bonding pads at connection positions of the FPC soft board using a high-temperature lead-free solder wire, and soldering a plurality of FPC soft boards meeting a length requirement of a customer using soldering iron whose temperature meets a standard into the lengthened FPC soft board; and b3. inspecting the appearance of the soldered FPC soft board, and testing the brightness and color temperature of the soldered FPC soft board, In the step c, the aging impact condition as follows: outage lasts for 2 minutes every lightening for 5 minutes, and such circulation is performed for 24 hours.

The step d specifically comprises the following steps:

d1. placing the whole FPC soft board which is qualified after aging impact on a workbench paved with an anti-static skin, and dividing to obtain single FPC soft bars;

d2. testing the brightness of each LED bead, and reeling the qualified LED bead;

d3. preparing an adhesive from raw materials according to a certain mass ratio, pouring into an adhesive box after uniformly shaking, and pulling out the reeled FPC soft bars from a reel so that the initial part of the FPC soft bar is completely infiltrated into the bottom of the adhesive box, and the adhesive completely covers the initial part of the FPC soft bar, wherein the adhesive comprises adhesives of 600A and 600B models in a mass ratio of 1:1;

d4. fixing the initial part of the FPC soft bar coated with the adhesive on a bell line of an inlet of the baking oven using silica gel, opening a traction switch of the baking oven, pulling the subsequent soft bar to be continued to infiltrate the adhesive, allowing the FPC soft bar infiltrating the adhesive to enter into the baking oven for baking and completely attaching the FPC soft bars with the adhesive; and d5. reeling and feeding into a next process step.

The step e specifically comprises the following steps:

e1. preparing silicone rubber and a vulcanizing agent including but not limited to a platinum vulcanizing agent according to a required mass ratio, and then stirring and overturning using a solid silica gel agitator until a mixture is sufficiently uniform to obtain a solid silica gel mixture.

e2. segmenting the uniformly stirred solid silica gel mixture according to a requirement;

e3. feeding the FPC soft bars delivered from d5 into an extruder equipped with an extrusion mold within 8 hours and feeding the segmented solid silica gel mixture, and simultaneously opening the switch of the baking oven and the extruder to start extrusion and baking for curing;

e4. placing the extruded FPC soft bar in an anti-static frame, and naturally cooling for 20 minutes at a ventilating place; and e5. testing the brightness and the color temperature of the LED bead, and then feeding into a next process step.

In the step e, the silicone rubber and the vulcanizing agent including but not limited to the platinum vulcanizing agent are mixed and uniformly mixed according to a required mass ratio.

A dispersing agent or color past is also added in the solid silica gel mixture.

The step f specifically comprises the following steps: cutting from the connection plate position of the FPC soft bar at first, then soldering a joint or a connection line required by a user when in use, then installing connectors at the two ends of the FPC soft bar using single-component room-temperature vulcanized silicone rubber, finally performing natural air drying and curing for 2 hours, and extruding and dispensing an LED neon lamp strip based on silica gel of FPC so as to complete processing.

Compared with the prior art, the disclosure has the following beneficial effects:

(1) In the disclosure, a material is cured while extruding on the basis of an extrusion technology in combination with the baking oven, and the whole processing technology achieves semi-automatic control, with low manual power cost and high processing efficiency. Qualification inspection is performed in each processing procedure, thereby greatly improving, the product rate of pass.

(2) In the disclosure, pasting is performed using high-temperature lead-free solder paste, thereby avoiding a situation that in the subsequent technology, solder paste is molten to damage a pasting effect.

(3) In the disclosure, when in use, the high-temperature unleaded solder wire is used, thereby avoiding a situation that when subsequent procedures such as extrusion and dispensing, solder paste is molten to damage the soldering effect of FPC.

DETAILED DESCRIPTION OF PREFERRED EMBODIMENTS

The disclosure will be further described in combination with examples, and embodiments of the disclosure include but are not limited to the following examples.

EXAMPLES

The process for manufacturing the LED neon lamp strip disclosed by the disclosure mainly comprises seven steps of: SMT pasting, soldering an FPC soft board, aging impact, pre-extrusion processing, extrusion, testing and packaging.

I. SMT Pasting

A total process of SMT pasting is as follows: high-temperature lead-free tin paste is printed on an FPC soft board using a tin paste printer; LED beads and other auxiliary components are pasted on the FPC soft board printed with the tin paste; then reflow soldering is performed on the pasted FPC soft board through a reflow soldering machine; and finally, whether a semi-finished product after reflow soldering is qualified is tested using a test tooling, and making a marker so as to flow to a soldering procedure. Specific process steps are as follows:

1. jetting: performing jet printing of a recognition code on a back surface of an FPC soft board using an ink-jet printing machine;

2. tin paste printing:

(1) tin paste warming: bottled high-temperature lead-free tin paste stored at a low temperature of 0-15° C. is taken from a refrigerator, and placing at room temperature for 4 hours to achieve sufficient warming;

(2) tin paste stirring: the warmed tin paste is stirred for 3 minutes with a tin paste agitator so as to sufficiently release stickiness and a soldering function of tin paste;

(3) tin paste printing: the stirred tin paste is coated on the soldering pad of the FPC soft board through a debugged tin paste printer and a steel mesh;

(4) tin paste visual inspection: whether the tin paste is precisely coated on the soldering pad of the FPC soft board is inspected.

Note: the coated FPC must be pasted within 10 minutes.

3. SMT pasting:

(1) loading: paste type LED beads and other auxiliary components are installed on a feeder through a debugged procedure on the pasting machine;

(2) SMT pasting: the pasting machine is turned on, the paste type LED beads and other auxiliary components are pasted on the FPC soft board coated with lead-free tin paste; and (3) paste visual inspection: whether all components of the pasted FPC soft board are precisely pasted, less pasted, leaked, misaligned, shifted and damaged, and have reverse pasting polarity is inspected, etc.

4. reflow soldering:

(1) setting reflow soldering machine parameters: the temperatures of 1-12 temperature regions (including upper and lower regions) of a reflow soldering machine are respectively set as 150, 160, 170, 180, 180, 180, 190, 210, 240, 255, 255 and 210° C., and a chain speed is set as 95 cm/min, until the temperature reaches a setting requirement and is stabilized;

(2) feeding for reflow soldering: the FPC soft board which is qualified after pasting is fed from an inlet of the reflow soldering machine, and flowing out the FPC soft board from an outlet of the reflow soldering machine after 8 minutes;

(3) visual inspection after tapping: the FPC soft board is picked up from the outlet of the reflow soldering machine for visual inspection to ensure that soldering is good and there are no bad problems such as no less components, damaged components, reverse component direction, deflected component, shift, false soldering, upward floating and tombstoning;

(4) testing: the brightness and color temperature are tested by connecting a test tooling according to a required voltage to ensure that the brightness and the color temperature are consistent.

(5) placing and transporting semi-finished products: a fact that qualified pasted semi-finished products are placed in an anti-static cart in turn to be transported to a light bar soldering procedure is inspected, wherein, the layer number of the stacked semi-finished products cannot be more than 20 layers.

Note: all the pasted FPC soft boards must complete reflow soldering within 2 hours.

II. Soldering FPC Soft Boards

A total process of soldering is as follows: the FPC soft board which is qualified after pasting is soldered to be in a length (in general, 5 m, 10 m and 20 m/strip) required by a customer; after soldering, appearance inspection as well as brightness and color temperature rest is performed. Specific process steps are as follows:

1. Lead-free manual soldering:

(1) setting temperature of soldering iron: the temperature of the soldering iron on a constant-temperature soldering station of 60 W is set as 360-400° C., until the temperature reaches a setting requirement and is stabilized;

(2) brushing soldering flux: the soldering flux is brushed at the two ends of the whole FPC board which is tidy; and (3) soldering: manually adding tin to a soldering pad at a junction using a high-temperature lead-free soldering wire; after adding tin, connecting and soldering the whole FPC soft boards in turn; when a soldering length required by the customer is met, it is needed to solder a connection plate. When in soldering, note: positive and negative poles must be in one-to-one correspondence.

2. Appearance inspection: appearance inspection is performed on soldering spots of the soldered FPC soft board to ensure no phenomena of false soldering, cold soldering, reverse pole soldering, floating soldering spots, damaged component, dropped soldering pads and the like.

3. Testing brightness and color temperature: brightness and color temperature are tested on the whole FPC soft board which is qualified by means of visual inspection after soldering through a special test tooling to ensure that the brightness and the color temperature are consistent.

III. Aging Impact

The whole FPC soft board which is qualified via testing is connected to an aging bracket required by a product for aging impact, wherein the aging impact condition is as follows; outage lasts for 2 minutes every lightening for 5 minutes, and such circulation is performed for 24 hours. Finally, the qualified whole FPC soft board semi-finished product is placed in an anti-static frame to flow to a next procedure.

IV. Pre-Extrusion Processing

A total process of pre-extrusion processing is as follows: at first, the whole FPC soft board semi-finished product which is qualified after aging is divided and reeled, the neon lamp strip is adhered with the adhesive and baked, and finally, the neon lamp strip adhered with the adhesive is tested, and then reeled on a large reel after being qualified. Specific process steps are as follows:

1. dividing: the whole FPC soft board which is qualified after aging impact is placed on a workbench paved with an anti-static skin, and dividing to obtain single FPC soft bars;

2. testing brightness: the brightness of each bead of the divided FPC soft bars is tested by means of brightening to ensure that there is no phenomena of dim lamps and sparkling lamps. The whole operation necessarily requires handle with care to avoid a situation that soft bars are damaged due to uncultivated operation;

3. reeling: the FPC soft bar which is qualified after testing is reeled using the reel, with 30 m/reel in general;

4. preparing the adhesive: preparing about 800 g/time in total according to a certain mass ratio, note: the prepared adhesive needs to be uniformly shaken, and meanwhile the adhesive is prevented from contacting eyes or a respiratory tract;

5. adhering the adhesive:

(1) setting parameters of a baking oven: 5 temperature regions of the baking oven are set as 170, 165, 165, 165 and 160° C., and a pulling speed is set as 5, until the temperature reaches a setting temperature and is stabilized;

(2) infiltrating the adhesive: the prepared adhesive is poured into an adhesive box, the reeled FPC soft bar hangs on the tooling and pulled out of the reel, so that the initial part of the FPC soft bar is completely infiltrated into the bottom of the adhesive box and the adhesive completely covers the FPC soft bar;

(3) baking: the initial part of the soft bar coated with the adhesive is fixed on a belt line at an inlet of the baking oven using silica gel, a pulling switch of the baking oven is opened to pull subsequent soft bars to continue to infiltrate the adhesive, the FPC soft bars infiltrated with the adhesive is allowed to enter the baking oven for baking, and the FPC soft bars are completely adhered with the adhesive;

(4) reeling after tapping: the baked FPC soft bar is reeled with the reel at an outlet of the baking oven, with 30 m/reel in general;

(5) soldering and reeling: the 30 m/reel FPC soft bar which is qualified via testing is reeled to the large reel, soldering is performed to form 240 m/reel, a pulling, FPC soft bar having a length of 5 m is soldered on the initial part of the soft bar so as to facilitate debugging when in extrusion.

Note: (1) the FPC soft bar adhered with the adhesive must be extruded within 8 hours; (2) the adhesive remained after preparation must be poured into a bottle with a cap and sealed, and the adhesive exceeding 24 hours cannot be used again.

V. Extrusion

A total process of extrusion is as follows: at first, solid silica gel is uniformly stirred, then the neon lamp strip adhered with the adhesive passes through the debugged extrusion mold and the baking oven for extrusion and curing, and finally, the cured neon lamp strip is cooled and test is performed. Specific process steps are as follows:

1. setting extrusion parameters: 5 temperature regions of the baking oven are set as 170, 165, 165, 165 and 160° C. in summer, and 180, 175, 175, 175, 170° C. in winter, until the temperature reaches a setting temperature and is stabilized, an extrusion speed of an extruder is adjusted to 8.5. (but an extrusion rotary knob cannot be opened), and the pulling speed of the baking oven is adjusted to 10;

2. stirring the gel:

(1) preparing the gel: preparing silicone rubber and a vulcanizing agent (including but not limited to a platinum vulcanizing agent) according to a ratio using a high-precise electronic scale;

(2) smelting the gel: stirring and overturning with a solid silica gel agitator, and stirring for 15 minutes so that the solid silica gel mixture is sufficiently uniform;

(3) segmenting the silica gel: the uniformly stirred silica gel is segmented according to a standard that the length is 30 cm, the width is 4 cm, and the height is 2 cm.

Note: (1) the solid silica gel which is placed in air after being stirred must be used within 12 hours, and must be uniformly stirred again before using; (2) the solid silica gel must be refrigerated in a refrigerator if being not used for a long term, and cannot be used if refrigeration time exceeds 7 days.

3. Installing and debugging an extrusion mold:

(1) installing an extruder: the extrusion mold is installed on a clean extruder, and internal and external molds are screwed, a discharge mold is fixed, then the pulling FPC soft bar in the large reel is allowed to pass through the internal mold of the extrusion mold, then fully filling the extruder with the segmented solid silica gel via a gel inlet of the extruder;

(2) primarily debugging the extruder: the extrusion rotary knob of the extruder is opened so that the pulling FPC soft bar is extruded by 0.5 m, then the extrusion rotary knob is closed, the position of the pulling FPC soft bar in the solid silica gel is observed, a discharge mold is adjusted so as to allow the pulling FPC soft bar to be located in the middle of the solid silica gel, and the solid silica gel is good in shape;

(3) secondarily debugging the extruder: the extrusion rotary knob is opened again so that the pulling FPC soft bar is extruded by 0.5 m, then the extrusion rotary knob is closed, and finally it is verified that the pulling FPC soft bar is located in the middle of the solid silica gel, and the whole solid silica gel is good in shape.

4. Extruding and baking for curing (1) starting extrusion: the bottom of the solid silica gel wrapped with the pulling FPC soft bar after extrusion is tightly adhered to the belt of the inlet of the baking oven, and the pulling switch of the baking oven and the extrusion rotary knob of the extruder are simultaneously opened to start extrusion;

(2) extrusion and baking: the extruded semi-finished product enters the baking oven for baking and curing, the shape of the extruded silica gel and positions of the FPC soft bats and beads in the solid silica gel are carefully observed, and note whether the extrusion rotary knob needs fine adjustment to ensure that the bottom of the extruded silica gel is tightly adhered to the belt of the baking oven and smoothly flows into the baking oven, partial silica gel is suspended in air to form a straight state and a good shape, the morphology of the silica gel is full and smooth, the shape is complete without dirty, and FPC is located in the middle of the solid silica gel;

(3) visual inspection after tapping: by tapping personnel, it is verified that the silica gel is completely cured when the extrusion soft bars of the pulling parts are just discharged, a curing situation is fed back to extrusion personnel, and meanwhile it is ensured that the cured semi-finished is completely put in a clean anti-static frame.

5. Testing: when extrusion is completed, the extruded semi-finished product in the anti-static frame is carried to a ventilating place to be naturally cooled for 20 minutes, the pulling parts after cooling are cut, the extruded semi-finished product is brightened through the test tooling to ensure that the brightness and the color temperatures of all the LED beads are consistent.

VI. Testing and Packaging

The product is brightened and cut from the cutting position of the connection plate, a connection line or a joint is soldered according to customer's requirement, plugs are installed at the two ends of the neon lamp strip using single-component room-temperature vulcanized silicone rubber, natural air drying is performed for 2 hours so that the acidic glue is cured, and extrusion and dispensing are performed on the finished products with a strip of silica gel so as to complete processing.

By adopting a brand new processing technology, the disclosure achieves automatic processing of LED soft lamp strips and double qualification inspection of man power and test tooling, and thus processing efficiency is high, cost is low, and water-proof and moisture-proof properties, luminance uniformity and color temperature consistency of the LED soft lamp strip can be effectively ensured. The disclosure has a high practical value and an application value.

The above examples are only preferred examples of the disclosure, which however are not for limiting the protection scope of the disclosure. Any variation made by adopting the design principle or made based on above disclosure without paying creative effort is within the protection scope of the appended claims.

I claim:

1. A process for manufacturing a silica gel extruded soft lamp strip, comprising the following steps:
    a. pasting LED (light-emitting diode) beads and other components on an FPC (flexible printed circuit) soft board, and performing reflow soldering;
    b. soldering the FPC soft board into a lengthened FPC soft board in a manner of lead-free manual soldering;
    c. performing aging impact on the lengthened FPC soft board;
    d. performing pre-extrusion processing on the FPC soft board which is qualified after aging impact;
    e. extruding the FPC board using a solid silica gel mixture in combination with an extrusion mold, and then baking using a baking oven to cure the silica gel; wherein the solid silica gel mixture is prepared from silicone rubber and a vulcanizing agent according to a required ratio; and
    f. clipping from a connection plate position of a cured semi-finished product, installing a plug, performing a product qualification test, packaging the qualified products and then putting in storage for later selling or use.

2. The process for manufacturing a silica gel extrusion soft lamp strip according to claim 1, wherein, the step a specifically comprises the following steps:
    a1. performing spray printing of a recognition code on a back surface of the FPC soft board;
    a2. coating lead-free solder paste at a bonding pad of the FPC soft board;
    a3. pasting the LED beads and other components on the FPC soft board within 10 minutes after the lead-free solder paste is coated;
    a4. putting the pasted FPC soft board into a reflow soldering machine having set parameters within 2 hours, taking out from an outlet after 8 minutes, visually inspecting at first, and then connecting a test tooling to test brightness and color temperature; and
    a5. transporting qualified products from step a4 to a next process step through an anti-static cart.

3. The process for manufacturing a silica gel extrusion soft lamp strip according to claim 2, wherein, the step b specifically comprises the following steps:
    b1. brushing soldering flux at bonding pads connected with two ends of the FPC soft board transported from step a;
    b2. manually adding tin to bonding pads at connection positions of the FPC soft board using a high-temperature lead-free solder wire, and soldering a plurality of FPC soft boards meeting a length requirement of a customer using soldering iron whose temperature meets a standard into the lengthened FPC soft board; and
    b3. inspecting an appearance of the soldered FPC soft board, and testing brightness and the color temperature of the soldered FPC soft board.

4. The process for manufacturing a silica gel extrusion soft lamp strip according to claim 3, wherein, in the step c, the aging impact condition is as follows: outage lasts for 2 minutes every lightening for 5 minutes, and such circulation is performed for 24 hours.

5. The process for manufacturing a silica gel extrusion soft lamp strip according to claim 4, wherein the step d specifically comprises the following steps:
    d1. placing the whole FPC soft board which is qualified after aging impact on a workbench paved with an anti-static skin, and dividing to obtain single FPC soft bars;

d2. testing brightness of each LED bead, and reeling the qualified LED bead;

d3. preparing an adhesive from raw materials according to a required ratio, pouring into an adhesive box after uniformly shaking, pulling out the reeled FPC soft bars from a reel so that an initial part of the FPC soft bar is completely infiltrated into a bottom of the adhesive box, and the adhesive completely covers the initial part of the FPC soft bar;

d4. fixing the initial part of the FPC soft bar coated with the adhesive on a belt line of an inlet of the baking oven using silica gel, opening a traction switch of the baking oven, pulling the subsequent soft bar to be continued to infiltrate the adhesive, allowing the FPC soft bar infiltrating the adhesive to enter the baking oven for baking and completely attaching the FPC soft bars with the adhesive; and d5. reeling and feeding into a next process step.

6. The process for manufacturing a silica gel extrusion soft lamp strip according to claim 5, wherein, the step e specifically comprises the following steps;

e1. preparing silicone rubber and a vulcanizing agent according to required mass ratio, then stirring and overturning using a solid silica gel agitator until a mixture is sufficiently uniform to obtain a solid silica gel mixture;

e2. segmenting uniformly stirred solid silica gel mixture according to a requirement;

e3. delivering the FPC soft bar delivered from d5 into an extruder equipped with an extrusion mold within 8 hours and feeding the segmented solid silica gel mixture, and meanwhile opening a switch of the baking oven and the extruder to start extrusion and baking for curing;

e4. placing the extruded FPC soft bar in an anti-static frame, and naturally cooling for 20 minutes at a ventilating place; and e5. testing the brightness and the color temperature of the LED bead, and then feeding into a next process step.

7. The process for manufacturing a silica gel extrusion soft lamp strip according to claim 6, wherein, in the step e, the silicone rubber and the vulcanizing agent are stirred and uniformly mixed according to a required ratio.

8. The process for manufacturing a silica gel extrusion soft lamp strip according to claim 7, wherein, a dispersing agent or color past is also added in the solid silica gel mixture.

9. The process for manufacturing a silica gel extrusion soft lamp strip according to claim 8, wherein, the step f specifically comprises the following steps: cutting from the connection plate position of the FPC soft bar at first, then soldering a joint or a connection line required by a user when in use, then installing connectors at the two ends of the FPC soft bar using single-component room-temperature vulcanized silicone rubber, finally performing natural air drying and curing for 2 hours, and extruding and dispensing an LED neon lamp strip based on silica gel of FPC so as to complete processing.

* * * * *